United States Patent [19]
Cheng et al.

[11] Patent Number: 5,746,613
[45] Date of Patent: May 5, 1998

[54] CARD EDGE CONNECTOR WITH EJECTOR

[75] Inventors: Lee-Ming Cheng, Cupertino; Edmond Choy, Union City, both of Calif.

[73] Assignee: Hon Hai Precision Ind. Co., Ltd., Taiwan

[21] Appl. No.: 811,506

[22] Filed: Mar. 4, 1997

Related U.S. Application Data

[63] Continuation-in-part of Ser. No. 420,478, Apr. 12, 1995, Pat. No. 5,634,803, and a continuation-in-part of Ser. No. 673,070, Jul. 1, 1996, Pat. No. 5,672,069.

[51] Int. Cl.$^6$ ................................................. H01R 13/62
[52] U.S. Cl. ............................................................. 439/157
[58] Field of Search ................................... 439/152–160

[56] References Cited

U.S. PATENT DOCUMENTS

| | | | |
|---|---|---|---|
| 5,108,298 | 4/1992 | Gimmel | 439/160 |
| 5,181,857 | 1/1993 | Layser | 439/157 |
| 5,273,447 | 12/1993 | Heiney et al. | 439/160 |
| 5,445,531 | 8/1995 | Billman et al. | 439/157 |
| 5,468,156 | 11/1995 | Flinchbaugh et al. | 439/157 |
| 5,470,242 | 11/1995 | Cheng et al. | 439/157 |
| 5,558,528 | 9/1996 | Cheng et al. | 439/160 |
| 5,637,004 | 6/1997 | Chen et al. | 439/157 |

*Primary Examiner*—Gary F. Paumen
*Assistant Examiner*—Brian J. Biggi

[57] ABSTRACT

A card edge connector (10) includes an insulative housing (12) defining a central slot (14) for receiving a card (100) therein. A cavity section (18) is provided at one end of the housing (12) with an alignment end wall (40) for aligning the inserted card (100) in a lengthwise direction. An ejector (20) is rotatably received within the cavity section (18) by means of a spindle (32), a center of which is relatively closer to an inner surface (42) of the ejector (20), wherein the inner surface (42) of the ejector (20) includes at least a first plane-like section (44) generally coplanar with the outer surface (45) of the end wall (40), a second arc-like section (46) generally conformable with the periphery of the spindle (32), and a third plane-like section (48) spaced from the outer surface (25) of the end wall (40) in a substantial distance, when such ejector (20) is in a vertical locked position with regard to the housing (12).

12 Claims, 7 Drawing Sheets

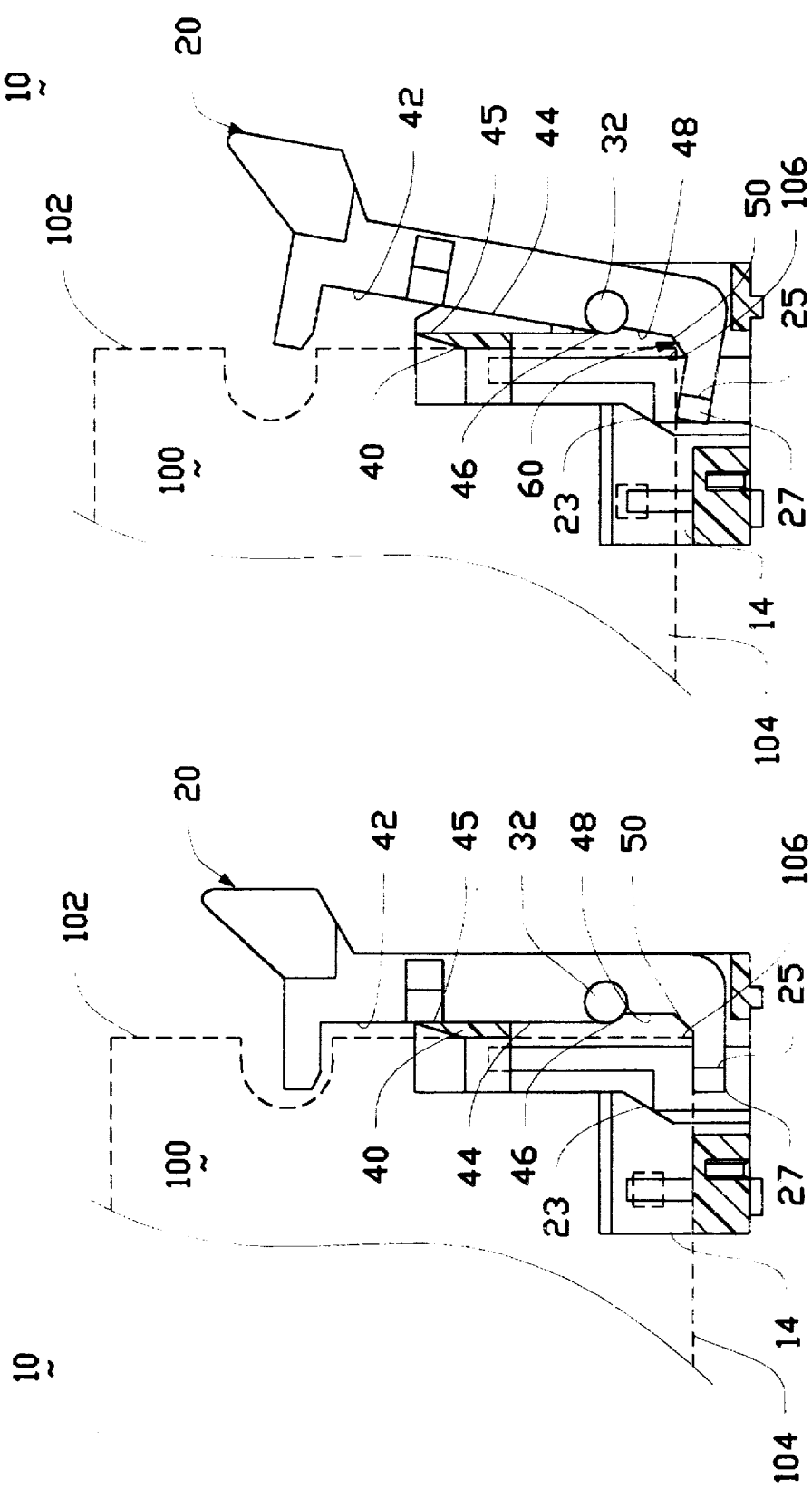

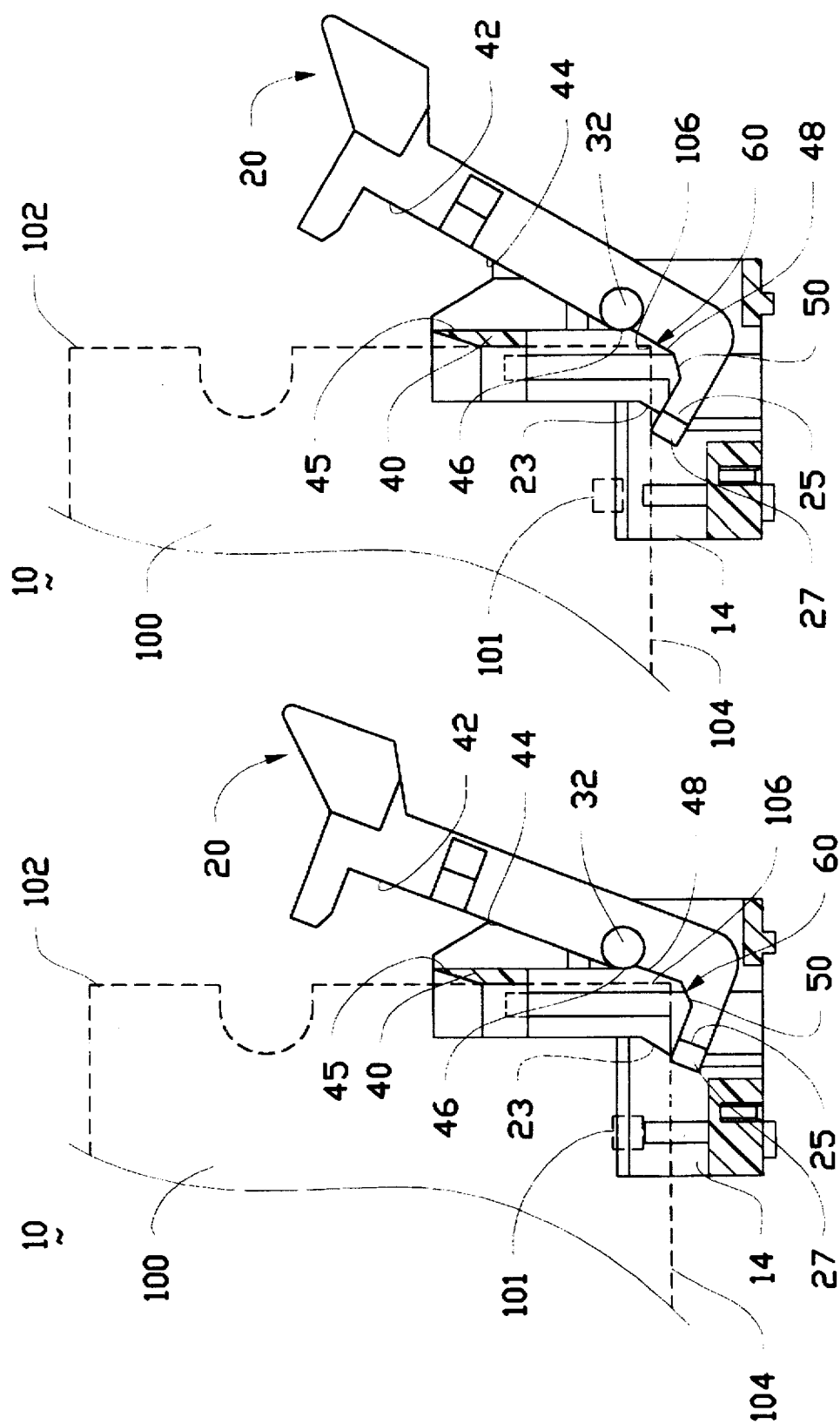

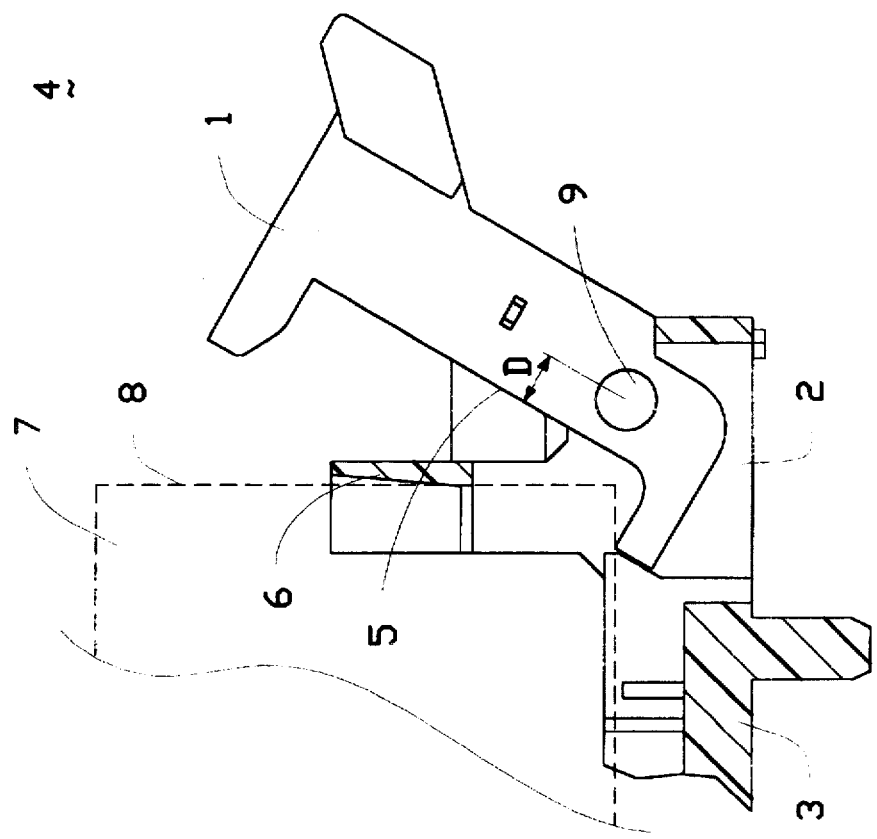
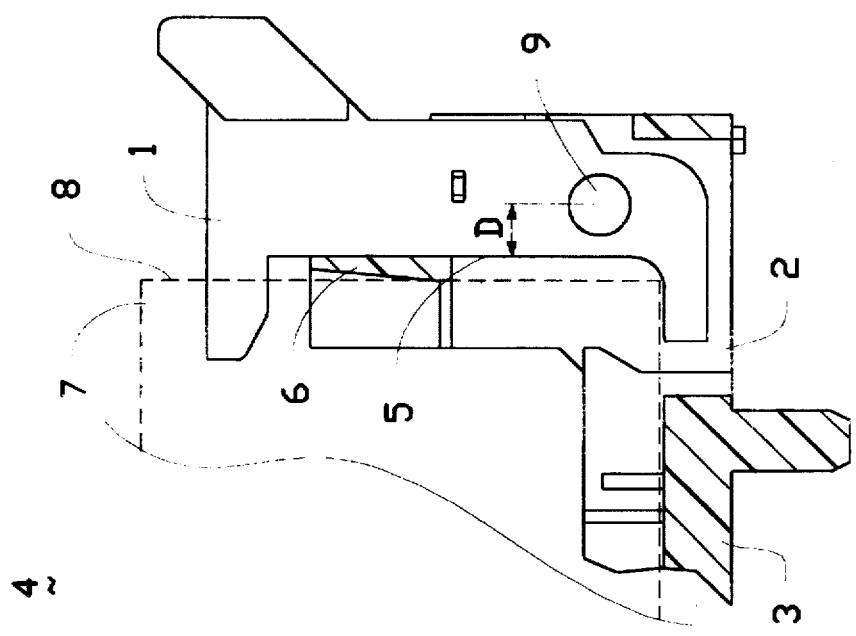
FIG.5 (A)
FIG.5 (B)

CARD EDGE CONNECTOR WITH EJECTOR

This application is a continuation-in-part of application Ser. No. 08/420,478 filed Apr. 12, 1995, now U.S. Pat. No. 5,634,803, and a continuation-in-part of application Ser. No. 08/673,070 filed Jul. 1, 1996, now U.S. Pat. No. 5,672,069.

BACKGROUND OF THE INVENTION

1. Field of the Invention

The present invention relates particularly to the card edge connector having at least one ejector at its one lengthwise end of releasably locking a module or a card with the card edge connector.

2. The Related Art

The parent application Ser. No. 08/420,478 filed Apr. 12, 1995, discloses a card edge connector with an ejector at one lengthwise end for ejecting the fully inserted card therefrom. FIG. 1 generally, which substantially is FIG. 5(A) of the parent application, shows the basic structures of the ejector itself and the corresponding connector housing thereabout. In FIG. 1, the ejector 1 is positioned in a cavity 2 at one end of the housing 3 of the connector 4 wherein the inner surface 5 of the ejector 1 abuts against an alignment wall 6 of the housing 3. FIG. 2, which substantially is FIG. 5(B) of the parent application, shows how the ejector 1 rotates to eject the inserted card 7 out of the housing 3. In this embodiment, it can be seen that the inner surface 5 of the ejector 1 keeps its straight configuration without the need to reshape itself for not interfering with the corresponding side edge 8 of the card 7 during rotation of the ejector 1. The situation generally results from the position of the spindle 9 with regard to the ejector 1. It can be understood that because there is a significant distance D between the center of the spindle 9 and the inner surface 5 of the ejector 1, the track of the inner surface 5 during rotation of the ejector 1 will not improperly invade the card area defined behind the side edge 8 of the card 7.

While, recently the connector 4 is required to reduce its whole lengthwise dimension for miniaturization. Because the main body of the housing 3 should keep the standard dimension for meeting arrangement of the pitch and the number of the contacts in the housing 3, it can not help but decrease the area of the end portion of the housing 3. One approach is to reduce the distance D between the center of the spindle 9 and the inner surface 5 of the ejector 1. Unfortunately, under this situation, the inner surface 5 is too close to the center of the spindle 9, thus tending to result in an interference occurring between the lower portion of the inner surface 5 and the bottom portion of the side edge 8 of the card 7 during rotation of the ejector 1 with regard to the housing 3.

Therefore, an object of the invention is to provide means on the ejector for avoidance of any interference with regard to the inserted card during rotation of the ejector.

SUMMARY OF THE INVENTION

According to an aspect of the invention, a card edge connector includes an insulative housing defining a central slot for receiving a card therein. A cavity section is provided at one end of the housing with an alignment end wall for aligning the inserted card in a lengthwise direction. An ejector is rotatably received within the cavity section by means of a spindle, a center of which is relatively closer to an inner surface of the ejector, wherein the inner surface of the ejector includes at least a first plane-like section generally coplanar with the outer surface of the end wall, a second arc-like section generally conformable with the periphery of the spindle, and a third plane-like section spaced from the outer surface of the end wall in a substantial distance, when such ejector is in a vertical locked position with regard to the housing.

BRIEF DESCRIPTION OF THE DRAWINGS

FIG. 3(A) is an enlarged perspective view of the ejector of FIG. 1.

FIGS. 4(A)–4(D) are fragmentary cross-sectional views of the card edge connector of FIG. 1 with an inserted card to show no interference between the ejector and the inserted card during rotation of the ejector with regard to the housing.

FIGS. 5(A) and 5(B) are cross-sectional view of a card edge connector of the parent application.

DETAILED DESCRIPTION OF THE PREFERRED EMBODIMENTS

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

Figure 1:
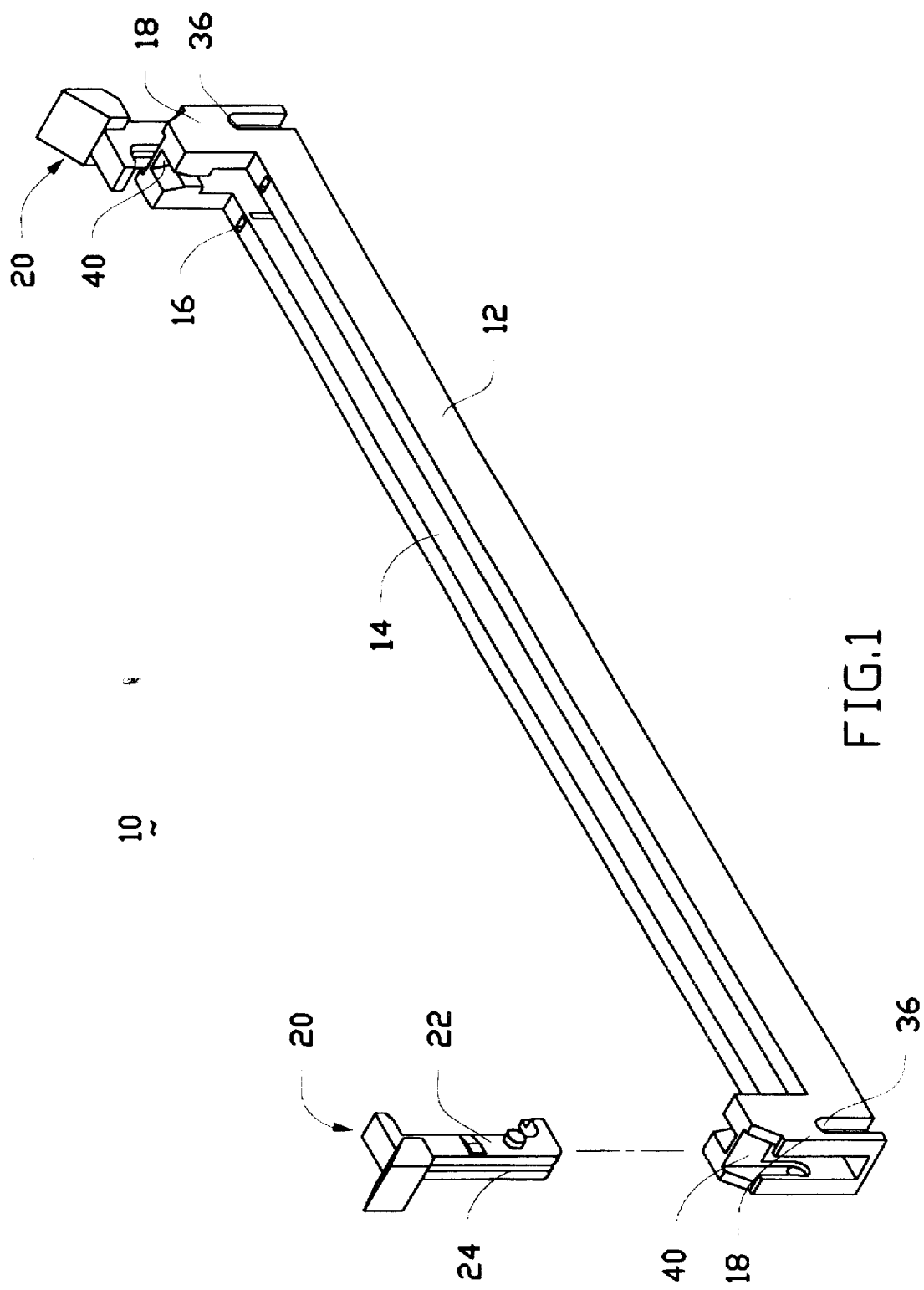
FIG. 1 is an exploded perspective view of a presently preferred embodiment of a card edge connector according to the invention.
Figure 2:
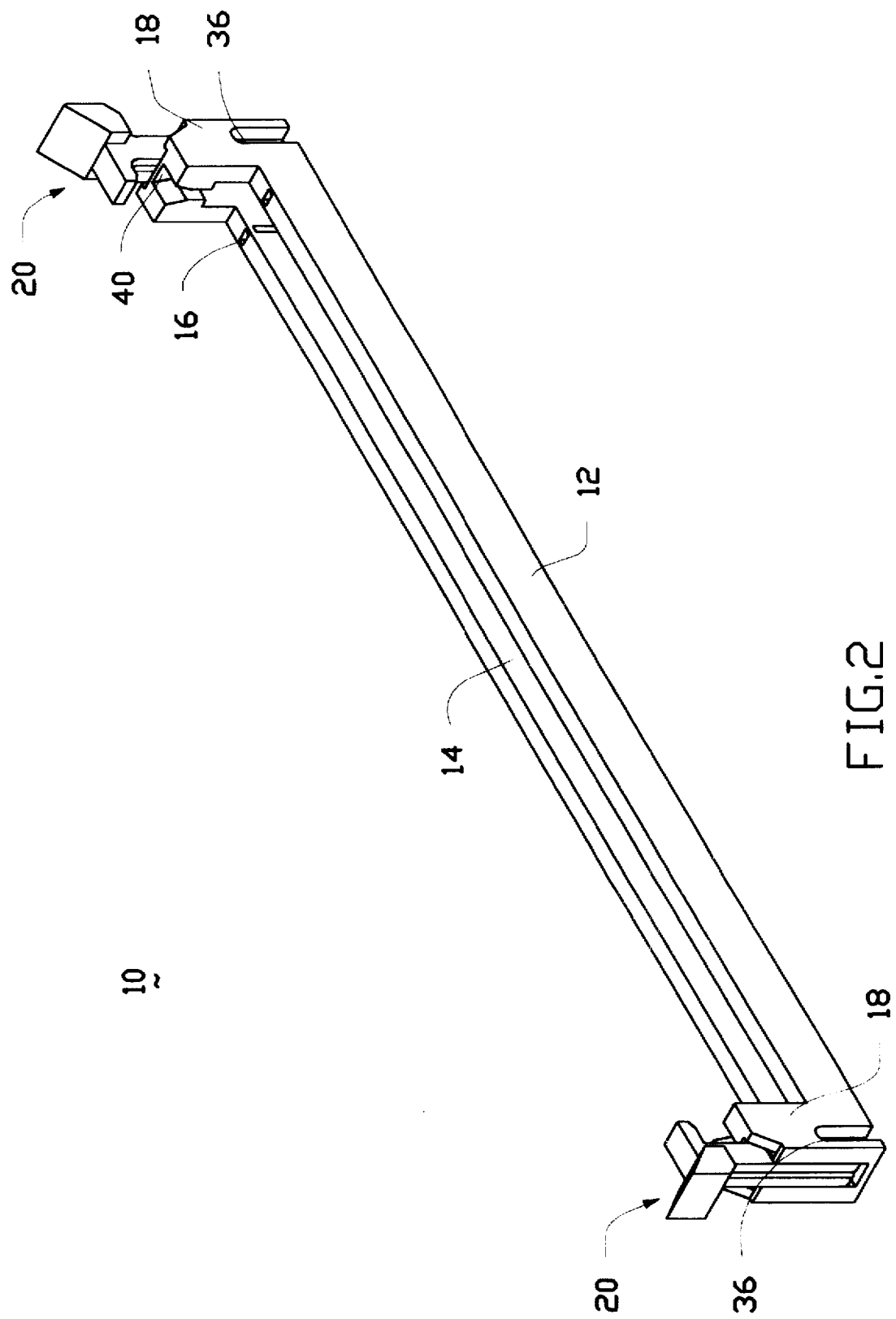
FIG. 2 is a perspective view of the assembled card edge connector of FIG. 1.
Figure 3:
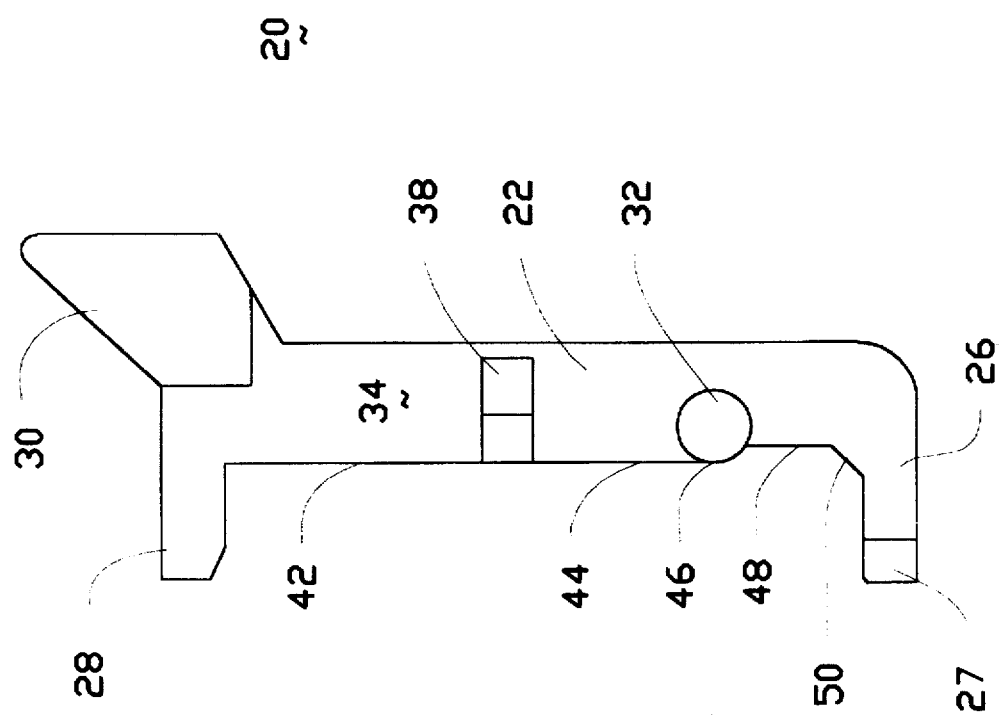
FIG. 3 is an enlarged plan view of the ejector of FIG. 1.
Figure 3:
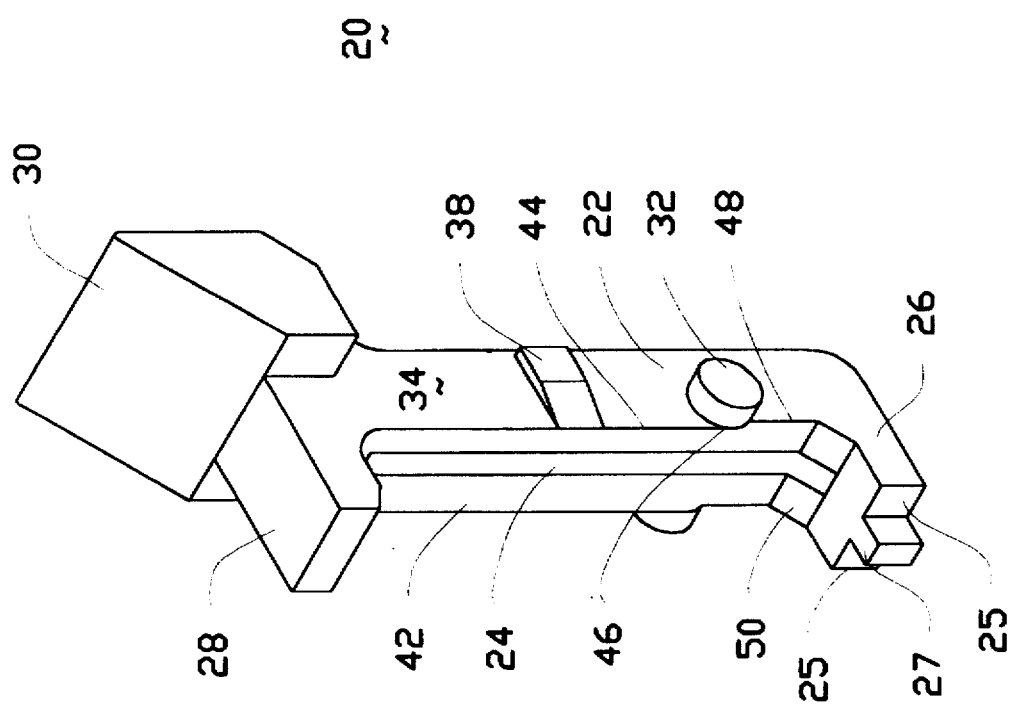

It will be noted here that for a better understanding, most of like components are designated by like reference numerals throughout the various figures in the embodiments. Attention is directed to FIGS. 1–3 wherein a card edge connector 10 includes an insulative housing 12 defining a central slot 14 along its lengthwise direction for receiving therein a card 100 (FIG. 4(A)–4(D)). A plurality of passageways 16 are positioned by two sides of the central slot 14 for receiving therein a corresponding number of contacts (not shown) wherein each contact partially projects into the slot 14 for engagement with the corresponding circuit pads 101 on the bottom portion of the card 100.

A pair of cavity sections or ejector-receiving sections 18 are respectively positioned at two elongated ends of the housing 12 for each receiving a corresponding ejector 20 therein. The ejector 20 includes a main body 22 defining a vertical slot 24 therealong for providing proper resiliency thereof for ease of installation of the ejector 20 into the cavity section 18 and ease of rotation of the ejector 20 with regard to the housing 12.

The ejector 20 further includes a kicker 26 extending from the bottom portion of the main body 22 toward the central slot 14, and a locking lug 28 extending from the top portion of the main body 22 toward the central slot 14. A lever portion 30 extends in an opposite direction to the locking lug 28. A pair of spindles 32 extend laterally on the lower portion of the two side surfaces 34 of the main body 22 of the ejector 20 for being receivably disposed in the corresponding pair of holes 36 in the cavity section 18 of the housing 12. Moreover, a pair of bumps 38 are formed about the midpoint of the two side surfaces 34 of the ejector 20 for providing the ejector with retention when the ejector is in a locked vertical position, or with retardation when the ejector is during rotation.

An alignment end wall 40 are provided on the cavity section 18 to confront the side edge 102 of the inserted card 100 for confinement of the inserted card 100 in the lengthwise direction along the housing 12. Correspondingly, the ejector 20 includes an inner surface 42 along its main body 22 wherein a first plane-like section 44 may abut against the outer surface 45 of the end wall 40 when the ejector 20 is in a locked vertical position. The inner surface 42 of the ejector 20 further includes a second arc-like section 46 in compliance with and sharing the same surface with a portion of the periphery of the spindle 32, and a third plane-like section 48 which is substantially outward offset from the first section 44. Also, a chamfer section 50 below the third section 48 is provided around the intersection of the main body 22 and the kicker 26.

Please refer to FIGS. 4(A)–4(D). FIG. 4(A) shows the inserted card 100 can be stably seated on the kicker 26 when the card 100 is fully embedded within the slot 14 whereby the contacts are mechanically and electrically engaged with the corresponding circuit pads 101 on the bottom portion of the card 100. Referring to FIG. 4(B), the ejector 20 is actuated to be rotated about the spindle 32 and the tip 27 of the kicker 26 rapidly moves upward to push the bottom edge 104 of the card 100 wherein the bottom corner 106 of the card 100 faces closely to the chamfer section 50 but does not interfere therewith.

Referring to FIG. 4(C), the ejector 20 rotates further outward and the tip 27 of the kicker 26 further more upward lifts the card 100 wherein the corner 106 of the card 100 closely faces to the third section 48 but without any interference occurring therebetween.

Last, referring to FIG. 4(D), the ejector 20 rotates to its final widest slanted position wherein the stopper face 25 of the kicker 26 beside the tip 27, abuts against the stop surface 23 of the housing 12 for preventing the ejector 20 from further outward rotating. Under this situation, the tip 27 of the kicker 26, which is aligned with and extends into the central slot 14, lifts the card 100 to a releasable position whereby the card 100 is disengaged from the contacts of the connector 10, thus allowing easy upward withdrawal of the card 100 therefrom. At this stage, the corner 106 of the card 100 faces to the third section 48 of the ejector 20 but without any interference.

It is appreciated that because the c enter of the spindle 32 is relatively so close to the first section 44 in the horizontal direction, i.e., the horizontal distance being under 1 mm in this embodiment, the second ark-like section 46 and the third plane-like section 48 are designed to form an offset section spaced from the outer surface 45 of the end wall 40 or the first section 44 of the main body 22 in the horizontal direction, thus preventing any interference occurring between the bottom corner 106 of the card 100 and the inner surface 42 of the ejector 20 during rotation of the ejector 20. From another viewpoint, the "projection point" 60 of the side edge 102 of the card 100 on the third section 48 or the chamfer section 50 of the main body 22 of the ejector 20 should be always lower than the tip 27 of the kicker 26 in the vertical direction during the whole process of the rotation of the ejector, thus assuring that the bottom corner 106 of the card 100 always is higher than its vertical corresponding "projection point" 60 on the ejector 20 for preventing any improper interference occurring therebetween.

It should be contemplated that to efficiently achieve the aforementioned non-interference object, two ways can be taken. One is to extend the kicker 26 inwardly in its horizontal direction for having its tip 27 position in a higher level than that of the common length kicker during rotation. Therefore, the card 100 can be lifted higher and its bottom corner 106 will be far away from the main body 22 of the ejector 20 thereunder. The other way is to have the third section 48 of the main body 22 of the ejector 20 much more offset from the first section 44 in the horizontal direction so as to reduce the possibility of interference with the bottom corner 106 of the card 100. Anyhow, in the first approach, excessively increasing the horizontal dimension of the kicker 26 may disadvantageously influence the mutual movement relationship between the rotation of the ejector and the lifting of the card 100, and in the second approach, excessively increasing offset of the third section 48 in the horizontal section 48 may disadvantageously jeopardize the structural strength of the ejector 20. In the present embodiment, for not jeopardizing smooth withdrawal of the card from the connector and also not jeopardizing the required structure strength of the ejector, the kicker 26 and the third section 48 of the ejector 20 keep their best dimensions presently believed, and thus there is only a very minor space remaining between the bottom corner 106 of the card 100 and the chamfer section 50 or the third section 48 of the main body 22 of the ejector 20 during each stage of the rotation of the ejector 20.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, person of ordinary skill in this field are to understand that all such equivalent structures are to be included within the scope of the following claims.

We claim:

1. A card edge connector comprising:
    an elongated insulative housing defining two lengthwise ends and a central slot between the two ends for receiving a card therein;
    a plurality of contacts positioned at two sides of the slot;
    a cavity section positioned at one of the two lengthwise ends of the housing;
    a card alignment wall formed between the cavity section and the central slot; and
    an ejector received within said cavity section and movable between a card locked and card ejected position, said ejector including a main body comprising a spindle pivotably connected to the housing, a first side near the card alignment wall, a second side opposite the first side, a card locking peg projecting from an upper portion of the main body toward the card alignment wall and a card ejecting kicker projecting from a lower portion of the main body toward the card alignment wall, said first side comprising a first section located between the locking peg and the spindle, said first section abutting the card alignment wall when the ejector is at the locked position, a second section continuing from the first section and sharing a same surface with a portion of a periphery of the spindle extending toward the second side of the main body and a third section continuing from the second section and extending toward the card ejecting kicker, said third section being offset from the first section a distance in a direction toward the second side of the main body.

2. The connector as described in claim 1, wherein the first section is of a straight type, the section is of an arc type, and the second section is of a straight type whereby the first section and the third section are parallel to each other, and further to the card alignment wall when said ejector is in the locked position.

3. The connector as defined in claim 1, wherein a chamfer section is provided between the third section and the card kicker.

4. A card edge connector comprising:

an elongated insulative housing having two lengthwise ends, a central slot between the two ends for receiving a card, and an ejector-mounting section at one of the two lengthwise ends;

a card alignment wall provided between the slot and the ejector-mounting section; and an ejector mounted to the ejector-mounting section;

said ejector including a first plane-like section abutting against the card alignment wall when the ejector is in a vertical locked position, and an offset section positioned below said first plane-like section wherein said offset section is substantially spaced from the first plane-like section a significant distance in a lengthwise direction of the housing opposite the card alignment wall when said ejector is in the vertical locked position.

5. The connector as defined in claim 4, wherein said offset section includes an arc-like section below the first plane-like section and a second plane-like section below the arc-like section.

6. The connector as defined in claim 5, wherein said ejector further includes a chamfer section below the second plane-like section.

7. The connector in accordance with claim 5, wherein the ejector comprises a spindle pivotably connected to two side walls of the housing perpendicular to the card alignment wall, and wherein the arc-like section is a portion of an outer periphery of the spindle.

8. The connector in accordance with claim 7, wherein the arc-like section continuously extends from the first plane-like section and the second plane-like section continuously extends from the arc-like section.

9. A card edge connector comprising:

an elongated insulative housing defining two lengthwise ends and a central slot therebetween for receiving a card therein;

a plurality of contacts disposed in the housing and projecting into the slot; and an ejector positioned in one of the lengthwise ends of the housing and having a main body having a spindle pivotably connected to the housing and an inner surface facing the central slot wherein the inner surface of said main body includes a first plane-like section on a top portion, a second arc-like section on a middle portion, and a third plane-like section on a bottom portion, and wherein said second arc-like section complies with an outermost surface of the spindle which projects in a lateral direction with the main body and whose center is relatively close to the first section in a lengthwise direction perpendicular to the lateral direction, and said third section is outward offset from the first section in the lengthwise direction of the housing.

10. An arrangement for removing a card from a card edge connector, said connector including an insulative housing defining a central slot for receiving said card therein, an ejector disposed adjacent one end of the housing and having a spindle pivotably connected to the housing, said ejector including a main body having an inner surface defining a main section on a top portion and an offset section on a bottom portion, said offset section being connected to the main section via an outer periphery of the spindle, a kicker extending inward and horizontally from the bottom portion of the main body, a relationship between a first dimension of an extension of the kicker in a horizontal direction and a second dimension of an offset of the offset section, being characterized in that a vertically projecting point of a bottom corner of the card on the offset section is lower than a tip of said kicker in a vertical direction so as to prevent any improper interference occurring between the bottom corner of the card and the main body of the ejector during rotation of the ejector.

11. A card ejector for use with a card edge connector, comprising:

a rectangular main body including a first side and a second side opposite the first side and a spindle located near the first side and adapted to pivotably connect the ejector to the connector, said first side having a first plane-like section at an upper portion of the body, a second arc-like section located on a middle portion of the body, continuing from the first plane-like section and extending toward the second side and sharing a same surface with a portion of a periphery of the spindle, a third plane-like section located at a lower portion of the ejector and offset from the first plane-like section a distance in a direction toward the second side, and a card ejecting kicker located below the third plane-like section and extending in a direction away from the second side.

12. The ejector as defined in claim 11, wherein a chamfer section is provided between the third plane-like section and the kicker.

* * * * *